United States Patent
Lee et al.

(10) Patent No.: US 8,834,730 B2
(45) Date of Patent: Sep. 16, 2014

(54) NANOPOROUS MEMBRANE AND MANUFACTURING METHOD THEREOF

(75) Inventors: Dae Sik Lee, Daejeon (KR); Jun Bo Yoon, Daejeon (KR); Dong Hoon Choi, Daejeon (KR); Byung Kee Lee, Daejeon (KR); Moon Youn Jung, Daejeon (KR); Seung Hwan Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 218 days.

(21) Appl. No.: 13/371,838

(22) Filed: Feb. 13, 2012

(65) Prior Publication Data

US 2012/0298625 A1    Nov. 29, 2012

(30) Foreign Application Priority Data

May 25, 2011  (KR) .................. 10-2011-0049500

(51) Int. Cl.
| | |
|---|---|
| B31D 3/00 | (2006.01) |
| B82Y 30/00 | (2011.01) |
| C23C 14/02 | (2006.01) |
| C23C 14/06 | (2006.01) |
| B82Y 40/00 | (2011.01) |
| C23C 16/56 | (2006.01) |
| C23F 1/02 | (2006.01) |

(52) U.S. Cl.
CPC ............... *C23C 14/06* (2013.01); *B82Y 30/00* (2013.01); *C23C 14/024* (2013.01); *B82Y 40/00* (2013.01); *C23C 16/56* (2013.01); *C23F 1/02* (2013.01)
USPC ......................................... 216/56

(58) Field of Classification Search
None
See application file for complete search history.

(56) References Cited

U.S. PATENT DOCUMENTS

| 6,206,065 B1 | 3/2001 | Robbie et al. | |
| 2004/0124092 A1* | 7/2004 | Black et al. | 205/363 |
| 2006/0273065 A1* | 12/2006 | Kim et al. | 216/2 |
| 2006/0278580 A1* | 12/2006 | Striemer et al. | 210/650 |
| 2010/0219079 A1* | 9/2010 | Routkevitch et al. | 205/175 |

FOREIGN PATENT DOCUMENTS

KR    1020100130016    12/2010

OTHER PUBLICATIONS

Osmanbeyoglu et al., "Thin Alumina nanoporous membranes for similar size biomolecule separation," Journal of Membrane Science (2009) 343:1-6.
Patzig et al., "Silicon Nanocolumns on Nanosphere Lithography Templated Substrates: Effects of Sphere size and Substrate Temperature," Journal of Nanoscience and Nanotechnology (2009) 9:1985-1991.
Striemer et al., "Charge- and size-based separation of macromolecules using ultrathin silicon membranes," Nature (Feb. 15, 2007) 445:749-753.
Tong et al., "Silicon Nitride Nanosieve Membrane," Nano Letters (2004) 4(2):283-287.
Zhou et al., "Development of two-level porosity during glancing angle deposition," Journal of Applied Physics (2008) 103:014307-1-014307-6.

* cited by examiner

*Primary Examiner* — Shamim Ahmed
*Assistant Examiner* — Bradford Gates
(74) *Attorney, Agent, or Firm* — Volpe and Koenig, P.C.

(57) ABSTRACT

In the present invention, a nanoporous membrane having a columnar structure is manufactured through a deposition technology used in a semiconductor process, and the size of a nanopore is adjusted by etching the lower surface of the manufactured nanoporous membrane or using a seed layer and a nanobead layer so that scaling up is available at a lowered process temperature and the size of the nanopore can be easily adjusted when manufacturing the nanoporous membrane having a columnar structure.

6 Claims, 10 Drawing Sheets

NANOPOROUS MEMBRANE AND MANUFACTURING METHOD THEREOF

CROSS-REFERENCE TO RELATED APPLICATIONS

This application is based on and claims priority from Korean Patent Application No. 10-2011-0049500, filed on May 25, 2011, with the Korean Intellectual Property Office, the disclosure of which is incorporated herein in its entirety by reference.

TECHNICAL FIELD

The present invention relates to a nanoporous membrane and a method for manufacturing the same. More specifically, the present invention relates to a nanoporous membrane and a method for manufacturing the same, wherein the nanoporous membrane having a columnar structure is manufactured through a deposition technology used in a semiconductor process, and the size of a nanopore is adjusted by etching the lower surface of the manufactured nanoporous membrane or by using a seed layer and a nanobead layer so that scaling up is available at a lowered process temperature and the size of the nanopore can be easily adjusted when manufacturing the nanoporous membrane having a columnar structure.

BACKGROUND

As a nanoporous membrane can separate nano-sized particles by size using a nano-sized pore, it is a future critical element that can be used in various fields such as a medical appliance, food and environment.

Most of the conventional nanoporous membranes were manufactured using polymer substances. The conventional nanoporous membranes had a highly complex structure and were greatly thick, which resulted in low selectivity and low permeability. Recently, in order to resolve these problems, efforts to manufacture a nanoporous membrane, which has a straight nanochannel and is thin, are actively being made using a micro machining technology.

The conventional methods for manufacturing a nanoporous membrane using the micro machining technology can be classified into: a method of forming a nano-sized pore by a specific type of chemical etching method, such as anodizing or ion-track etching, on a thin film formed on a substrate; a method of forming a nano-sized pore using a carbon nanotube as a mold; and a method of forming a nano-sized pore using an ion beam of high energy.

However, the above methods of forming a nanopore cannot be commonly used. Thus, they are difficult to be reproduced. Moreover, scaling up is difficult because those methods were prepared by using equipment generally designed and manufactured at laboratory level. Additionally, the method of using an ion beam of high energy is labor intensive in process, which requires high process costs.

SUMMARY

The present invention was devised to solve the aforesaid problems. The objective of the present invention is to provide a nanoporous membrane and a method for manufacturing the same, wherein the nanoporous membrane having a columnar structure is manufactured through a deposition technology used in a semiconductor process, and the size of a nanopore is adjusted by etching the lower surface of the manufactured nanoporous membrane or by using a seed layer and a nanobead layer so that scaling up is available at a lowered process temperature and the size of the nano pore can be easily adjusted when manufacturing the nanoporous membrane having a columnar structure.

One aspect of this invention includes a nanoporous membrane characterized by comprising a first protective layer formed on both surfaces of a substrate and a nanoporous thin film with a columnar structure formed on the first protective layer, which is formed in the upper surface of the substrate, through a physical vapor deposition (PVD) process or a chemical vapor deposition (CVD) process, and patterning a part of the first protective layer formed in the lower surface of the substrate so that the substrate and a part of the first protective layer are etched.

The method according to the second aspect of this invention is characterized by comprising: forming a first protective layer on the both surfaces of a substrate; forming a nanoporous thin film having a columnar structure by depositing one of the metallic materials, oxides, nitrides and fluorides on the first protective layer formed in the upper surface of the substrate through the PVD process or the CVD process; forming a second protective layer in the thin film; patterning the first protective layer formed in the lower surface of the substrate to expose a part of the lower surface of the substrate; etching the exposed part of the substrate until a part of the first protection layer underneath the nanoporous thin film is exposed; etching the exposed part of the first protective layer to expose the nanoporous thin film having a columnar structure; and removing the second protective layer.

The method according to the third aspect of this invention is characterized by comprising: forming a first protective layer on both surfaces of a substrate; forming a nanoporous thin film having a columnar structure by depositing one of the metallic materials, oxides, nitrides and fluorides on the first protective layer formed in the upper surface of the substrate through a physical vapor deposition method or a chemical vapor deposition method; forming a second protective layer in the thin film; patterning the first protective layer formed in the lower surface of the substrate to expose a part of the lower surface of the substrate; etching the exposed part of the substrate until a part of the first protection layer underneath the nanoporous thin film is exposed; etching the exposed part of the first protective layer underneath the nanoporous thin film to expose the nanoporous thin film having a columnar structure; adjusting the size of the nanopores by etching the exposed part of the nanoporous thin film partially; and etching the second protective layer to remove the second protective layer.

The method according to the fourth aspect of this invention is characterized by comprising: forming a first protective layer on both surfaces of a substrate; forming a seed layer in the upper surface of the substrate; forming a nanoporous thin film having a columnar structure by depositing one of the metallic materials, oxides, nitrides and fluorides on a seed layer formed in the upper surface of the substrate through a physical vapor deposition method or a chemical vapor deposition method; forming a second protective layer in the thin film; patterning the first protective layer formed in the lower surface of the substrate to expose a part of the lower surface of the substrate; etching the exposed part of the substrate until a part of the first protection layer underneath the seed layer is exposed; etching the exposed part of the first protective layer underneath the seed layer to expose the seed layer; etching the exposed part of the seed layer to expose the nanoporous thin film having columnar structure; and etching the second protective layer to remove the second protective layer.

The method according to the fifth aspect of this invention is characterized by comprising: forming a first protective layer on both surfaces of a substrate; forming a nanobead layer in the upper surface of the substrate; forming a nanoporous thin film having a columnar structure by depositing one of the metallic materials, oxides, nitrides and fluorides on the nanobead layer formed in the upper surface of the substrate through a physical vapor deposition method or a chemical vapor deposition method; forming a second protective layer in the thin film; patterning the first protective layer formed in the lower surface of the substrate to expose a part of the lower surface of the substrate; etching the exposed part of the substrate until a part of the first protection layer underneath the nanobead layer is exposed; etching the exposed part of the first protective layer underneath the nanobead layer to expose the nanobead layer; etching the exposed part of the nanobead layer to expose the nanoporous thin film having the columnar structure; and etching the second protective layer to remove the second protective layer.

The said thin film is characterized by comprising one of SiO2, Si3N4 and silicon carbide.

In the step of forming the thin film, the PVD process is characterized by including a sputtering deposition method or a thermal evaporation method.

In the step of forming the thin film, the CVD process is characterized by including atmospheric pressure chemical vapor deposition (APCVD), low-pressure chemical vapor deposition (LPCVD) or plasma enhanced chemical vapor deposition (PECVD).

In the step of forming the thin film, the metallic materials are characterized by including at least one from Ni, Cr, Co, Fe, Ti, Pt and Al; the oxides are characterized by including at least one from indium tin oxide (ITO), ZnO, SiO and TiO2; the nitrides are characterized by including at least one from TiN, CrN and NbN; and the fluorides are characterized by including CaF2 and MgF2.

In the step of forming the second protective layer, the second protective layer is characterized by including at least one from SiO2, Si3N4, silicon carbide and electroplated Au, Cu and Ni.

In accordance with the present invention, a nanoporous membrane having a columnar structure is manufactured through a deposition technology used in a semiconductor process, and the size of a nanopore is adjusted by etching the lower surface of the manufactured nanoporous membrane or by using a seed layer and a nanobead layer so that scaling up is available at a lowered process temperature and the size of the nanopore can be easily adjusted when manufacturing the nanoporous membrane having a columnar structure.

In accordance with the present invention, a thin film having a columnar structure is formed through the PVD process or the CVD process without including a specific etching step or an additional process to form a nano-sized pore, and thus is used as a nanoporous membrane. Accordingly, reproducibility of elements can be enhanced in terms of process, and the process costs can be reduced with mass production.

Further, the present invention allows a low temperature process, because it does not require a heat treatment process. Accordingly, micro fluid channels and electronic devices can be easily integrated.

DETAILED DESCRIPTION

Figure 1:
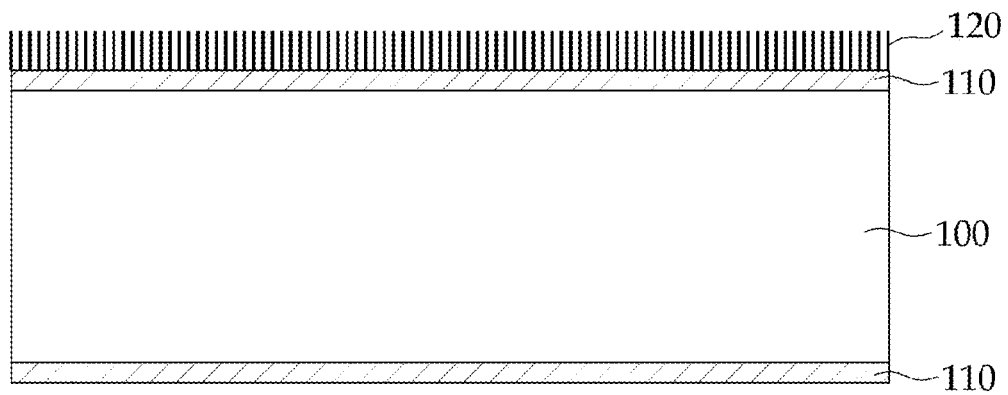
FIGS. 1 to 6 show a process flow of a method for manufacturing a nanoporous membrane in accordance with an example of the present invention.

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here. Also, prior to describe particularly the present disclosure, it is to be understood that like numerals represent like constitutional elements throughout the accompanying drawings, and the detailed description relating to the known technical constitution will be omitted in order to unnecessarily obscure the gist of the present disclosure.

The present invention relates to a nanoporous membrane having a columnar structure and a method for manufacturing the same, as set out below.

A nanoporous membrane in accordance with the present invention is characterized by comprising a first protective layer formed on both surfaces of a substrate and a nanoporous thin film with a columnar structure formed on the first protective layer, which is formed in the upper surface of the substrate, through the PVD process or the CVD process, and patterning a part of the first protective layer formed in the lower surface of the surface so that the substrate and a part of the first protective layer are etched.

A method for manufacturing the nanoporous membrane in accordance with the present invention is characterized by forming a nanoporous membrane, which comprises: forming a first protective layer in a substrate for etch stop; forming a thin film having a columnar structure through the PVD process or the CVD process; forming a second protective layer in the thin film; removing the first protective layer to remove the substrate of the lower nanoporous thin film and the first protective layer; adjusting the size of the pore by etching a part of the lower nanoporous thin film; and removing the second protective layer.

It is desirable that the first protective layer select a material having excellent etching selectivity with respect to the substrate.

In the process of forming the thin film, it is desirable that the PVD process include a sputtering deposition method or a thermal evaporation method.

In the process of forming the thin film, it is desirable that the CVD process include APCVD, LPCVD or PECVD.

In the process of forming the thin film, it is desirable that the metallic materials include at least one from Ni, Cr, Co, Fe, Ti, Pt and Al.

In the process of forming the thin film, it is desirable that the oxides include ITO, ZnO, SiO and TiO2.

In the process of forming the thin film, it is desirable that the nitrides include TiN, CrN and NbN.

In the process of forming the thin film, it is desirable that the fluorides include at least one from CaF2 and MgF2.

In the process of forming the second protective layer, it is desirable that the second protective layer be formed of a material having high etching selectivity with respect to the nanoporous thin film formed in the process of forming the thin film and high mechanical and chemical strength.

It is desirable that the method of etching the lower surface in the process of adjusting the size of the pore include a sputtering deposition method and an ion-milling method.

Referring to FIGS. 1 to 6, an example of the method for manufacturing the nanoporous membrane having a columnar structure in accordance with the present invention is set out below.

FIGS. 1 to 6 show a process flow of the method for manufacturing the nanoporous membrane in accordance with the present invention.

FIG. 1 shows a process of forming a first protective layer 110 and a nanoporous thin film 120. As shown in FIG. 1, the first protective layer 110 is formed on both surfaces of a substrate 100. The substrate 100 includes a silicon substrate, a glass substrate or a plastic substrate. The first protective layer 110 can be formed through LPCVD, PECVD or APCVD.

A thin film 120 having a nano-sized pore is formed in one surface of the first protective layer 110 due to the columnar structure.

Figure 2:
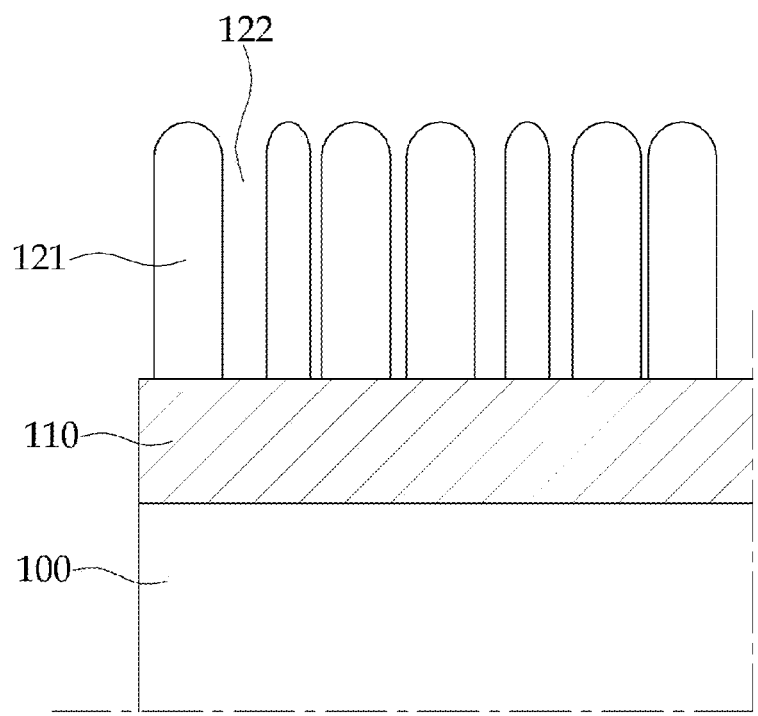

FIG. 2 shows an enlarged figure of a thin film 120 having a columnar structure.

As shown in FIG. 2, a nanopore 122 is formed to be vertical to the substrate 100 between columnar grains 121.

It is desirable that the thin film 120 be formed to have a columnar structure through the PVD process.

The thin film 120 can include metallic materials, oxides or nitrides. Here, the metallic materials for forming the thin film 120 include Ni, Cr, Co, Fe, Ti, Pt and Al. Further, the oxides include ITO, ZnO, SiO and TiO2. The nitrides include TiN, CrN and NbN. Further, CaF2 and MgF2 can be used as the materials to form the thin film 120. The PVD process for forming the thin film 120 includes a sputtering deposition method or a thermal evaporation method. Meanwhile, when the specific materials are deposited by increasing a deposition temperature through the CVD process, a preferred orientation in the z-axis direction allows the nanopore to form naturally a vertical columnar structure. The CVD process includes APCVD, LPCVD or PECVD.

A nano-sized pore 122 having a columnar structure can be produced when a deposition material for forming the thin film 120 reaches the substrate 100 and when a surface diffusion does not occur. That is, when the deposition material reaches the substrate 100 and the temperature of the substrate 100 is low (e.g., a normal temperature), the deposition material is not stabilized and immediately grows to have a columnar structure. Therefore, in the case where the deposition material is deposited by use of a sputtering deposition method, a thermal evaporation method or an electron beam evaporation method, the nanopore 122 are formed to have a columnar structure by depositing the material at a normal temperature or cooling the substrate 100 instead of heating the substrate 100.

Meanwhile, in the nanopore, it is possible to adjust the size of the pore 122 due to the atomic shadowing effect according to an incident flux angle at which the deposition material is deposited.

Figure 3:
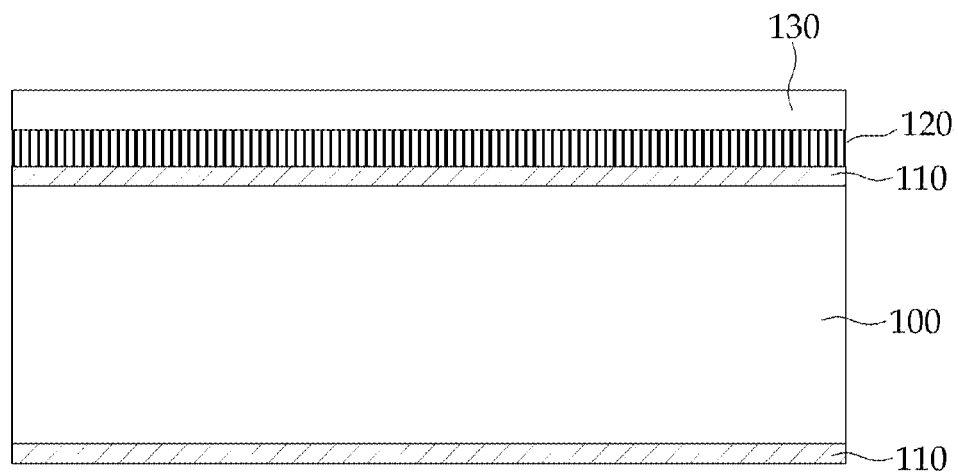

Referring to FIG. 3, below is a process of forming a second protective layer 130.

As shown in FIG. 3, the second protective layer 130 is formed in the nanoporous thin film 120. A process of forming the second protective layer is a subsequent process to the process of forming the thin film 120. Thus, the second protective layer 130 is required to be formed of a material having an excellent mechanical strength. Further, it is desirable that the second protective layer 130 be formed of a material having etching selectivity with respect to the substrate 100, the first protective layer 110 and the nanoporous thin film 120.

Accordingly, it is desirable that the second protective layer 130 be formed of a material having an excellent mechanical strength, such as SiO2, Si3N4. Further, it is desirable that the second protective layer 130 be formed of a metal that is relatively thick, such as electroplated Au, Cu and Ni.

Figure 4:
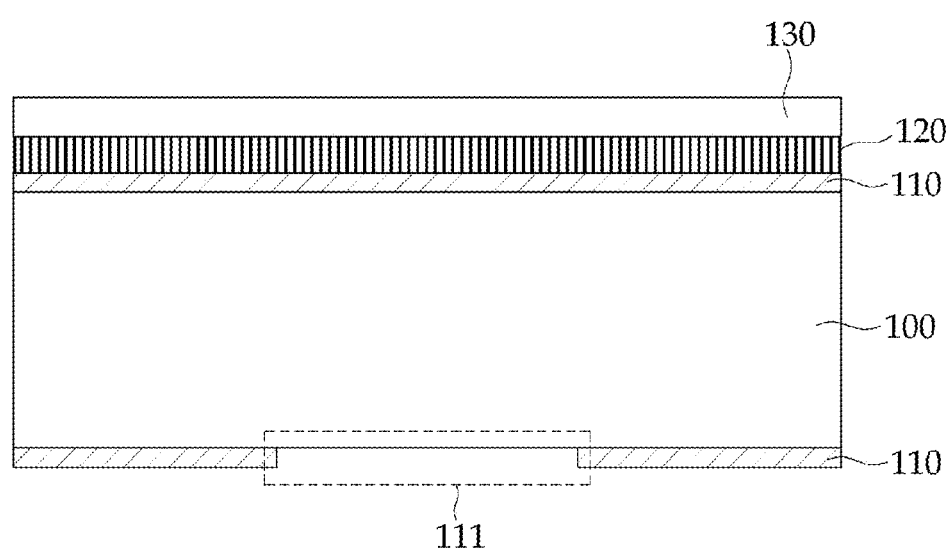
Figure 5:
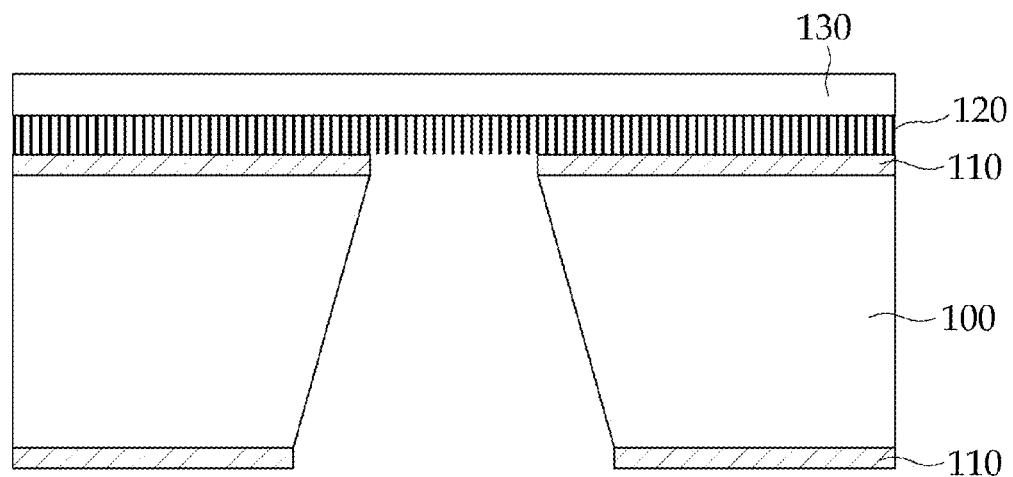

Referring to FIGS. 4 and 5, below is a process of etching the substrate 100 and the first protective layer 110.

As shown in FIG. 4, a part 111 of the first protective layer 110 is patterned in order to be used as a mask for etching the substrate 100. It is desirable to pattern the first protective layer 110 by using a dry etching method or a wet etching method.

Thereafter, as shown in FIG. 5, the first protective layer 110 etches the substrate 100 through the patterned part 111. Here, it is desirable that the substrate 100 is dry-etched or wet-etched towards the depth direction of the substrate 100 having anisotropy. The first protective layer 110 has high etching selectivity with respect to the substrate 100, and thus is no more etched when the etchant or the etching gas encounters with the first protective layer 110. Generally, it is difficult to uniformly etch the substrate 100, because the substrate is relatively thick. If etching the substrate is not stopped by the first protective layer 110, the nanoporous thin film 120 may be physically or chemically damaged by the etching gas or etchant for etching the substrate 100. Accordingly, as stated above, it is desirable that the first protective layer 110 be formed of a material having excellent etching selectivity with respect to the substrate 100.

As shown in FIG. 5, it is desirable that the first protective layer 110 placed in the region, in which the substrate 100 is removed, be etched after etching the substrate 100 is completed. Here, it is desirable to use a dry etching method or a wet etching method in order to remove the first protective layer 110.

Figure 6:
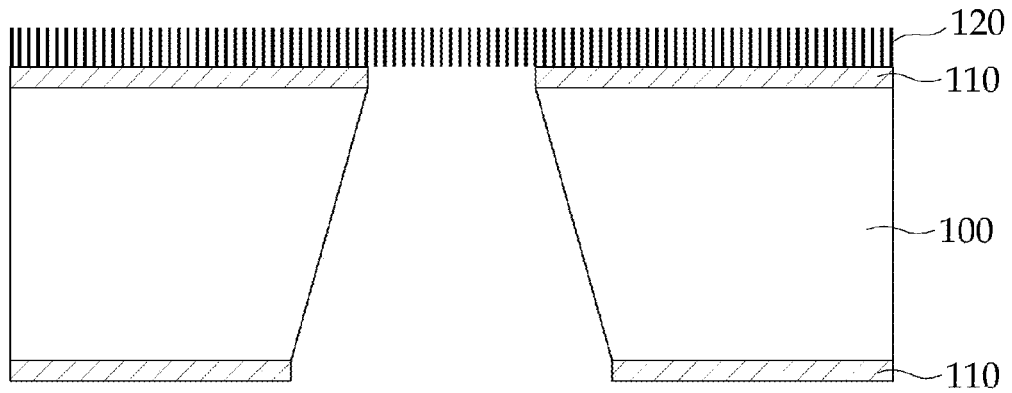

Referring to FIG. 6, below is a process of removing the second protective layer 130.

As shown in FIG. 6, a membrane having a nanopore caused by a columnar is formed structure by removing the second protective layer 130. Here, a wet etching method or a dry etching method can be employed in order to remove the second protective layer 130. Once the second protective layer 130 is removed, a nanoporous membrane having a columnar structure that is in the air.

Figure 7:
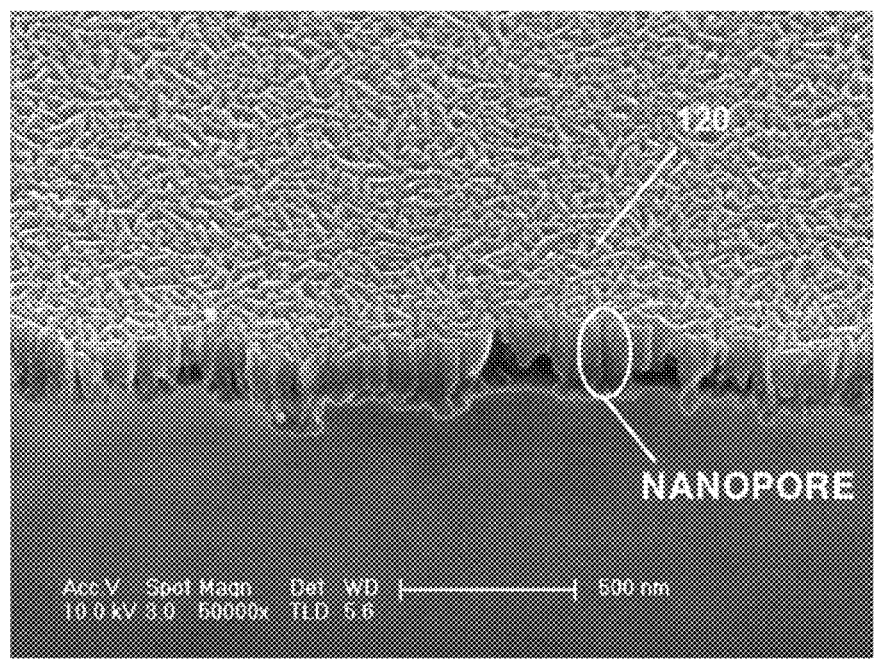
FIG. 7 shows an example of electron microscope photograph of a nanoporous membrane manufactured according to the process flow illustrated in FIGS. 1 to 6.

Meanwhile, FIG. 7 shows an example of an electron microscope photograph of the nanoporous membrane manufactured in accordance with the process flow as shown in FIGS. 1 to 6.

The electron microscope photograph as shown in FIG. 7 shows a nanoporous thin film 120.

Meanwhile, as stated above, a shadowing effect generated by roughness of the surface is one of the causes of forming a columnar structure. Accordingly, the size of the nanopore can be adjusted by adjusting roughness of the surface deposited.

Further, the size of the nanopore varies depending on the increase of the thickness of the thin film having a columnar structure.

Accordingly, the size of the nanopore can be adjusted by using the above two features.

Referring the FIGS. 8 to 19, Examples 1 to 3 for the method of adjusting the size of the nanopore in the nanoporous membrane having a nanopore with a columnar structure is set out below.

Figure 8:
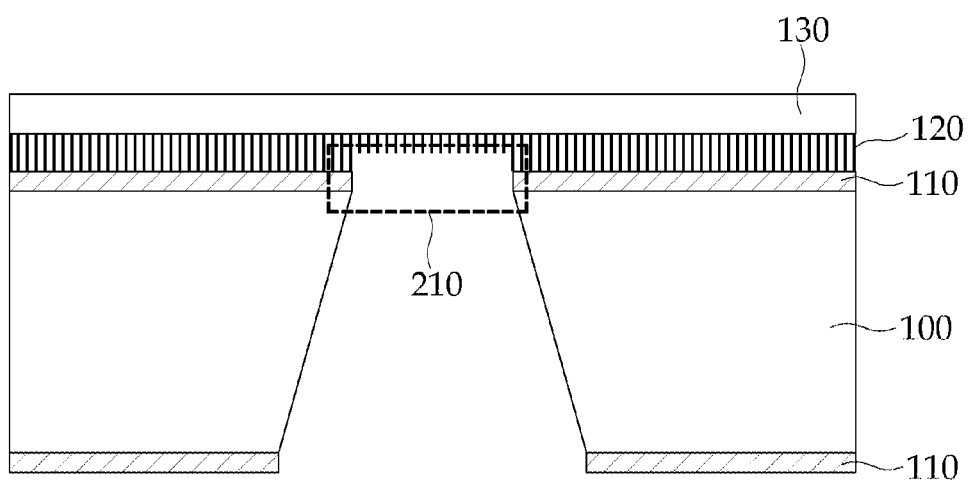
FIGS. 8 and 9 show a process flow of a method for adjusting the size of a nanopore in the nanoporous membrane in accordance with Example 1 of the present invention.
Figure 9:
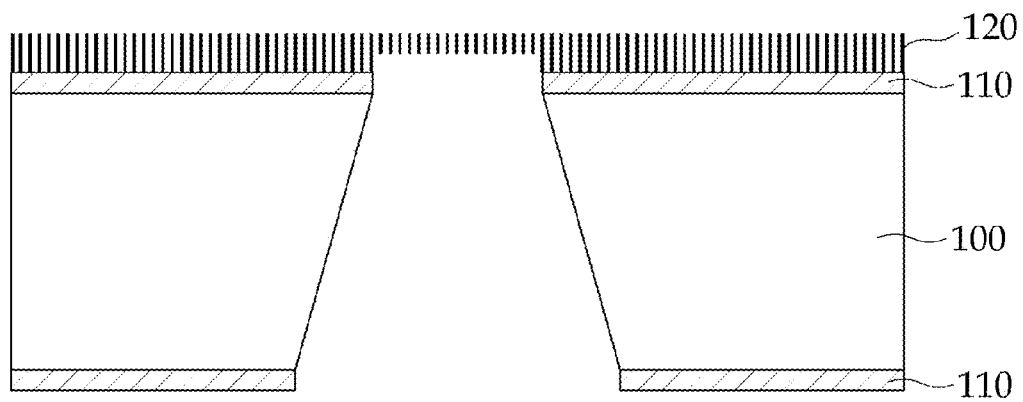

FIGS. 8 and 9 show a process flow of Example 1 for the method of adjusting the size of the nanopore in the nanoporous membrane in accordance with the present invention.

Referring to FIGS. 8 and 9, a method for adjusting the size of the nanopore by using the etching of the lower surface in accordance with Example 1 of the present invention.

First, forming the first protective layer 110, forming the thin film 120 having a columnar structure and etching the substrate 100 are conducted as shown in FIGS. 1 to 4.

As shown in FIG. 8, it is desirable to etch a part 210 of the thin film 120 having a columnar structure in order to adjust the size of the nanopore. Here, it is desirable to employ a dry etching method, which has a constant etching rate towards the front of the substrate 100.

As shown in FIG. 9, once the second protective layer 130 is removed, a nanoporous membrane, in which the size of the nanopore is adjusted, is formed.

FIGS. 10 to 14 are a process flow of Example 2 for the method for adjusting the size of the nanopore in the nanoporous membrane in accordance with the present invention.

Referring to FIGS. 10 to 14, below is a review of the method for adjusting the size of the nanopore by using a seed layer in accordance with Example 2 of the present invention.

Figure 10:
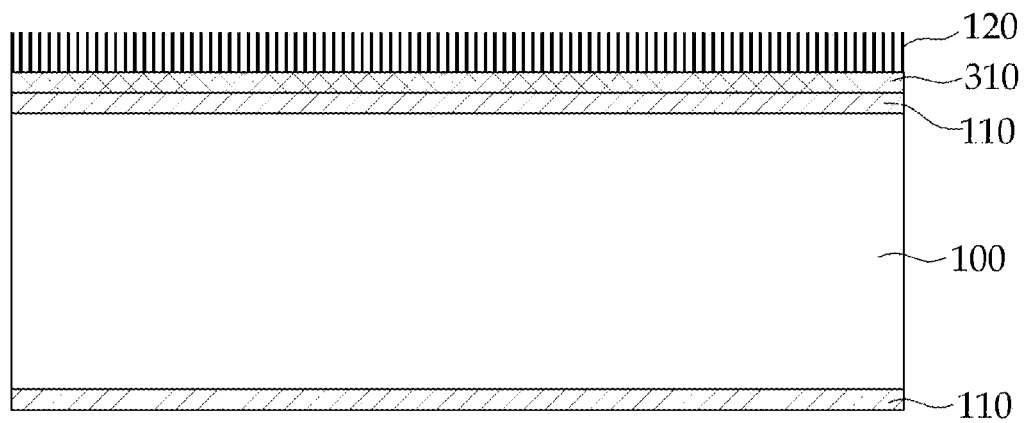
FIGS. 10 to 14 show a process flow of a method for controlling the size of a nanopore in the nanoporous membrane in accordance with Example 2 of the present invention.

As shown in FIG. 10, the protective layer 110 is formed on both surfaces of the substrate 100. Here, the materials of the substrate 100 and the first protective layer 110 and the forming method thereof are the same as the example explained through FIG. 1.

A seed layer 310 is formed on the first protective layer 110. It is desirable that the seed layer 310 have high etching selectivity with respect to the nanoporous thin film 120.

The seed layer 310 can be formed by using PVD, LPCVD, PECVD or APCVD. Here, it is desirable that the seed layer 310 include a subsequent process in order to have high surface roughness. Further, it is desirable to employ a sputtering deposition method or an ion milling method as a subsequent process.

Thereafter, the thin film 120 having a nano-sized pore is formed in the seed layer 310 due to a columnar structure. It is desirable that the thin film 120 be formed by using the aforementioned materials and methods.

Figure 11:
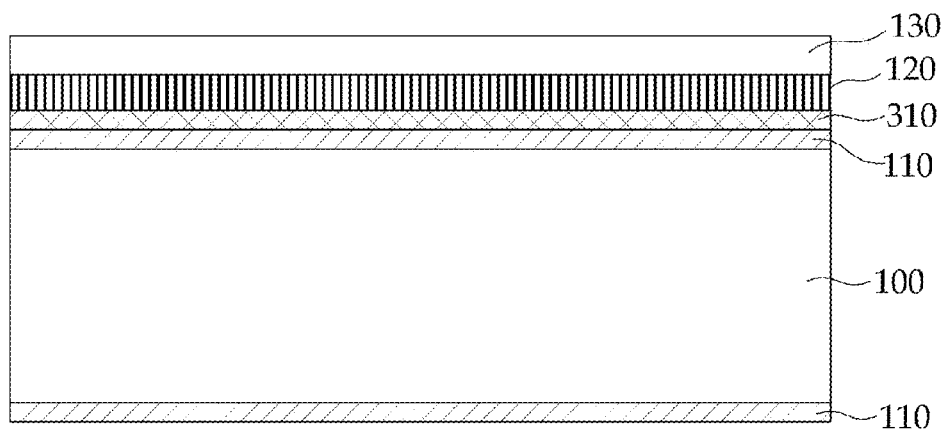

As shown in FIG. 11, the second protective layer 130 is formed in the thin film 120 having a nano-sized pore. It is desirable that the second protective layer 130 have etching selectivity with respect to the substrate 100, the first protective layer 110, the seed layer 310 and the thin film 120.

Accordingly, it is desirable that the second protective layer be formed of a material having an excellent mechanical strength, such as SiO2, Si3N4 and a silicon carbide. It is also desirable that the second protective layer 130 be formed of metals that are relatively thick, such as electroplated Cu and Ni.

Figure 12:
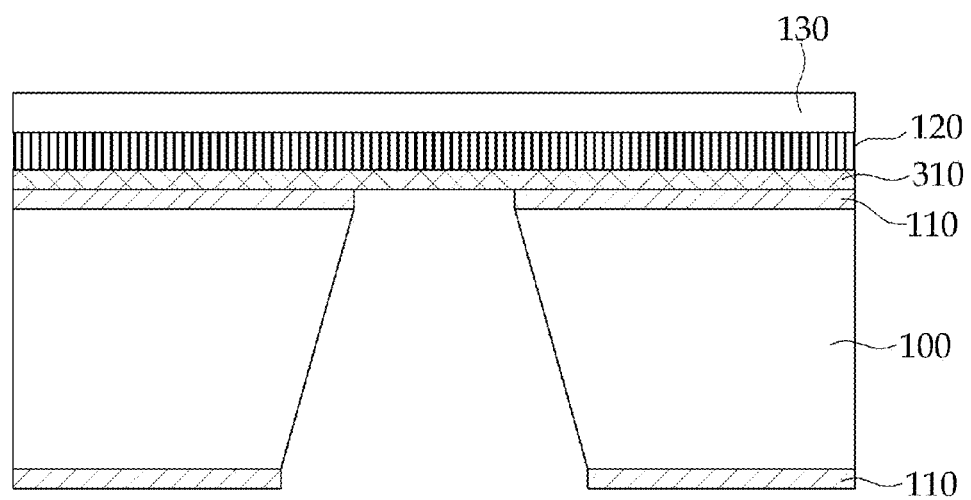

After forming the second protective layer 130, the substrate 100 is etched and the first protective layer 110 is patterned, as shown in FIG. 12. It is desirable to pattern the substrate 100 and the first protective layer 110 in the same way as the above example explained through FIG. 5.

Figure 13:
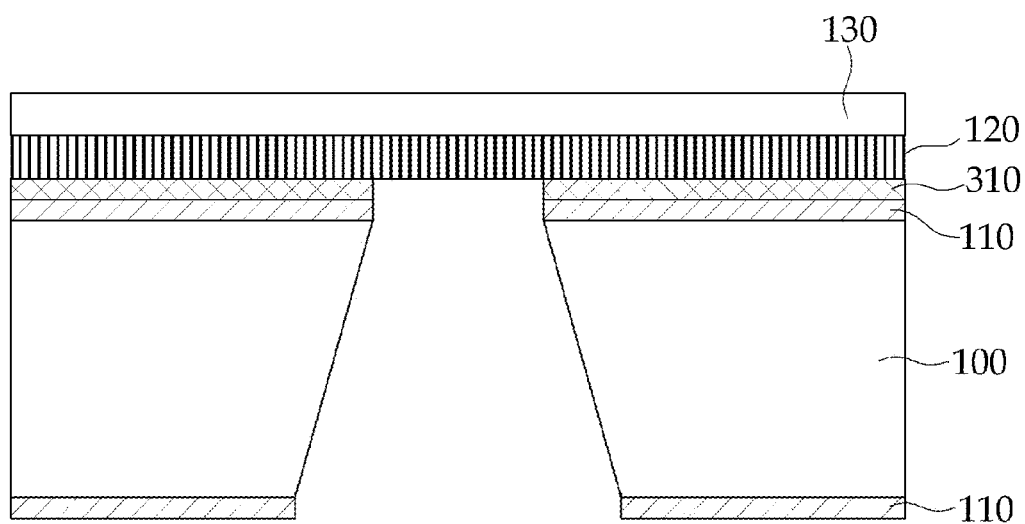

As shown in FIG. 13, the seed layer 310 is etched after patterning the substrate 100 and the first protective layer 110. It is desirable to etch the seed layer 310 in the limited region in which the substrate 100 is removed. It is desirable that the seed layer 310 be dry-etched or wet-etched.

Figure 14:
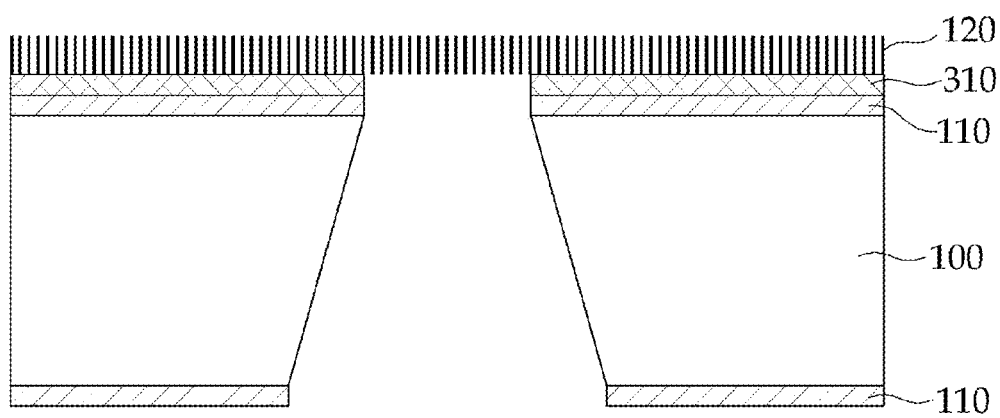

As shown in FIG. 14, a membrane having a nanopore caused by a columnar structure is formed by removing the second protective layer 130. Here, a wet etching method or a dry etching method can be employed in order to remove the second protective layer 130. Once the second protective layer is removed, a nanoporous membrane having a columnar structure, which is in the air, is formed.

FIGS. 15 to 19 show a process flow of Example 13 for the method for adjusting the size of the nanopore in the nanoporous membrane in accordance with the present invention.

Referring to FIGS. 15 to 19, below is a review of the method for adjusting the size of the nanopore by using the nanobead layer in accordance with Example 3 of the present invention. The method shown in FIGS. 15 to 19 is a method for adjusting the size of the nanopore by using the nanobead method instead of the method of using the seed layer as explained in FIGS. 10 to 14.

Figure 15:
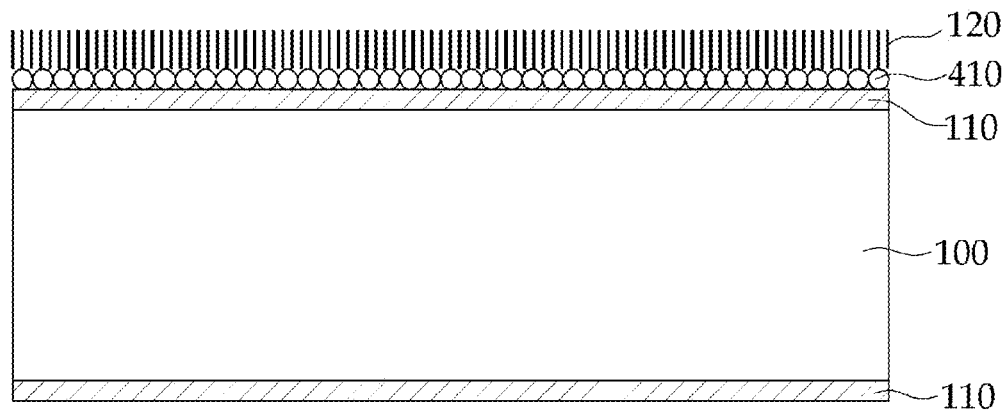
FIGS. 15 to 19 show a process flow of a method for controlling the size of a nanopore in the nanoporous membrane in accordance with Example 3 of the present invention.

First, as shown in FIG. 15, the first protective layer 110 is formed on both surfaces of the substrate 100. Here, the materials of the substrate 100 and the first protective layer 110 and the forming methods thereof are the same as the example as explained through FIG. 1.

A nanobead layer 410 is formed on the first protective layer 110. It is desirable that the nanobead layer 410 have high etching selectivity with respect to the nanoporous thin film 120. It is desirable to form the nanobead layer 410 by using a spin coating method. Here, it is desirable to use a nanobead layer 410 equally dispersed in a solvent. After the spin coating, it is desirable that the solvent evaporate and only the nanobead layer 410 be left. Here, the size of the nanopore can be adjusted depending on the size of the nanobead.

Thereafter, a thin film 120 having a nano-sized pore caused by a columnar structure is formed on the nanobead layer 410. It is desirable to form the thin film 120 by using the materials and methods in the example as explained through FIG. 1.

Figure 16:
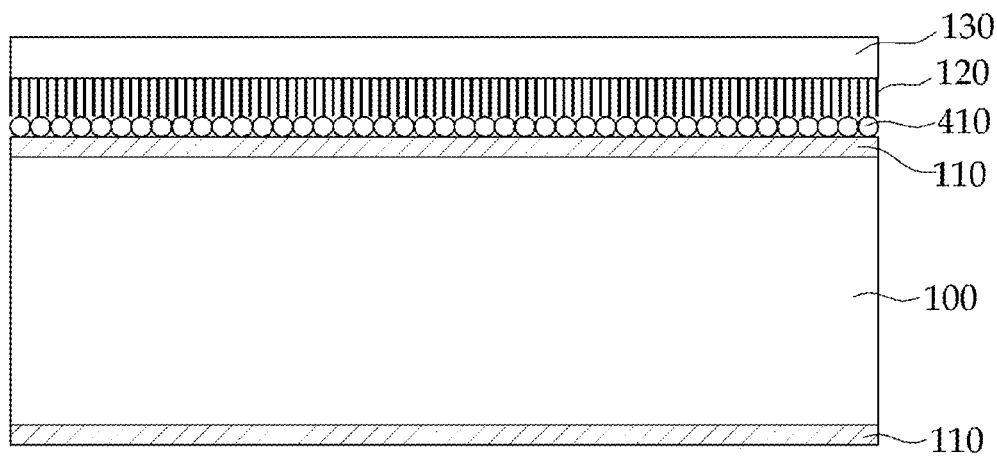

As shown in FIG. 16, the second protective layer 130 is formed on the substrate 120 have a nano-sized pore. It is desirable that the second protective layer 130 have etching selectivity with respect to the substrate 100, the first protective layer 110, the seed layer 310 and the thin film 120.

Accordingly, it is desirable that the second protective layer 130 be formed of a material having an excellent mechanical strength, such as SiO2, Si3N4 and a silicon carbide. It is also desirable that the second protective layer 130 be formed of metals that are relatively thick, such as electroplated Cu and Ni.

Figure 17:
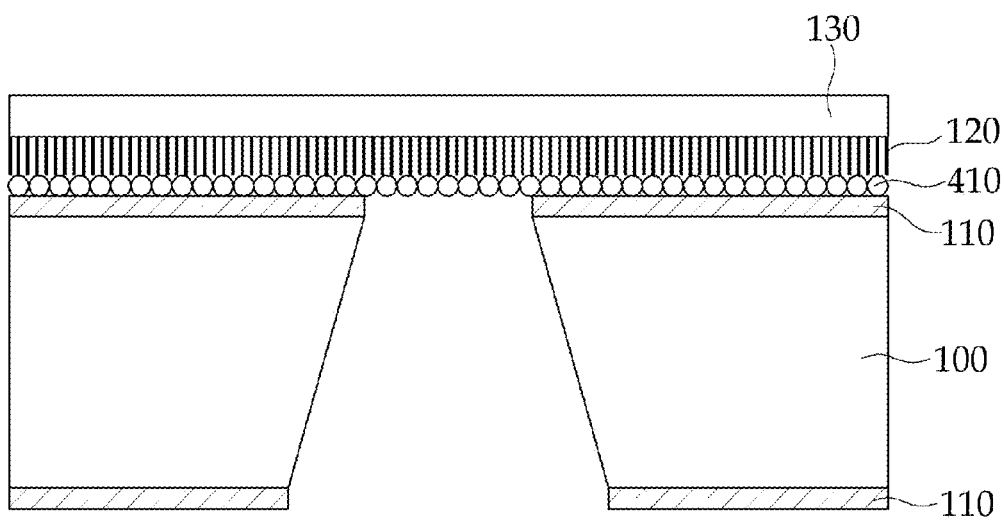

After forming the second protective layer 130, the substrate 100 is etched and the first protective layer 110 is patterned, as shown in FIG. 17. It is desirable to pattern the substrate 100 and the first protective layer 110 in the same way as the above example explained through FIG. 5.

Figure 18:
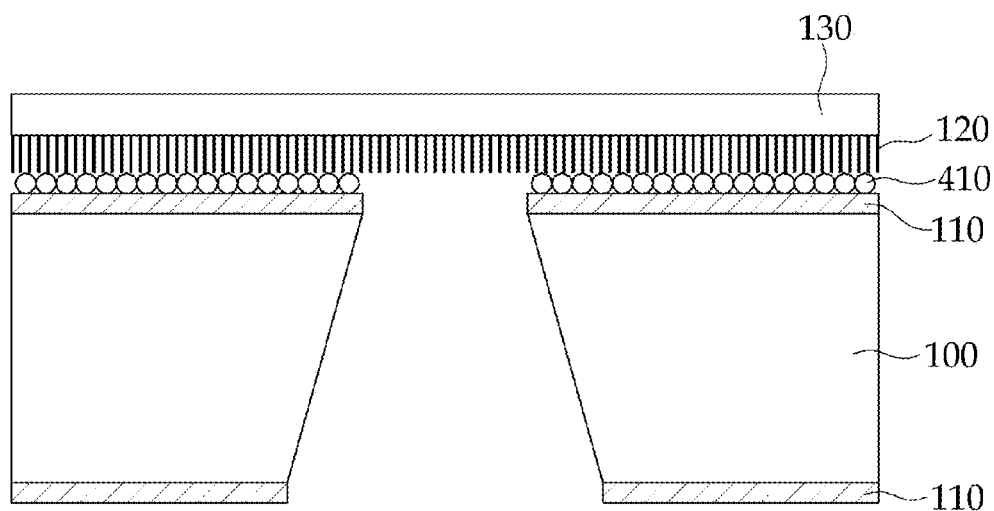

As shown in FIG. 18, the nanobead layer 410 is etched after patterning the substrate 100 and the first protective layer 110. It is desirable to etch the nanobead layer 410 in the limited region in which the substrate 100 is removed. It is desirable to etch the seed layer 310 by using a dry etching method or a wet etching method.

Figure 19:
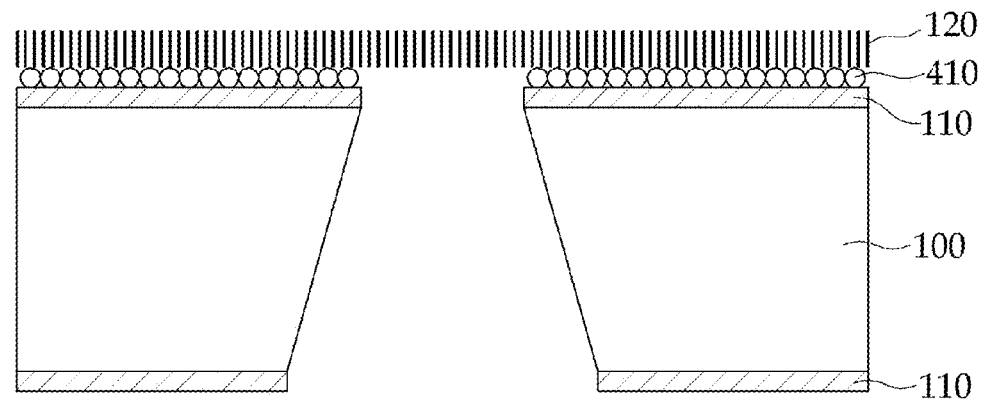

As shown in FIG. 19, a membrane having a nanopore caused by a columnar structure is formed by removing the second protective layer 130. Here, a wet etching method or a dry etching method can be employed in order to remove the second protective layer 130. Once the second protective layer 130 is removed, a nanoporous membrane having a columnar structure is formed through the nanobead layer 410.

The above description merely exemplifies the present invention, and can be variously modified by a person having an ordinary skill in the art to which the claimed invention pertains within the scope of the subject matter of the claimed invention. Accordingly, the present invention is not limited by the examples disclosed in the specification of the subject application. The scope of the present invention should be interpreted based on the claims, and to include all techniques that are within the equivalent scope.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for manufacturing a nanoporous membrane, the method comprising:
   forming a first protective layer on both surfaces of a substrate;
   forming a nanoporous thin film having a columnar grain structure by depositing one of metallic materials, oxides, nitrides and fluorides on the first protective layer formed in the upper surface of the substrate through a physical vapor deposition method or a chemical vapor deposition method at a normal temperature or cooling the substrate;
   forming a second protective layer in the thin film;
   patterning the first protective layer formed in the lower surface of the substrate to expose a part of the lower surface of the substrate;
   etching the exposed part of the substrate until a part of the first protection layer underneath the nanoporous thin film is exposed;
   etching the exposed part of the first protective layer underneath the nanoporous thin film to expose the nanoporous thin film having the columnar grain structure;
   adjusting the size of the nanopores by etching the exposed lower part of the nanoporous thin film partially in order to remove an amorphous layer formed in the deposition at the normal temperature or cooling the substrate; and
   etching the second protective layer to remove the second protective layer,
   wherein the nanopores are formed to be vertical to the substrate between columnar grains, wherein the size of the nanopores varies depending on an increase of a thickness of the nanoporous thin film having the columnar grain structure,
   wherein the first protective layer is formed of a material having etching selectivity with respect to the substrate and wherein the second protective layer is formed of a material having etching selectivity with respect to the substrate, the first protective layer and the nanoporous thin film.

2. The method of claim 1, wherein the size of the nanopores is adjusted due to the atomic shadowing effect according to an incident flux angle at which the deposition material is deposited.

3. A method for manufacturing a nanoporous membrane, the method comprising:
   forming a first protective layer on both surfaces of a substrate;
   forming a seed layer having surface roughness in the upper surface of the substrate;
   forming a nanoporous thin film having a columnar grain structure by depositing one of metallic materials, oxides, nitrides and fluorides on a seed layer formed in the upper surface of the substrate through a physical vapor deposition method or a chemical vapor deposition method;
   forming a second protective layer in the thin film;
   patterning the first protective layer formed in the lower surface of the substrate to expose a part of the lower surface of the substrate;
   etching the exposed part of the substrate until a part of the first protection layer underneath the seed layer is exposed;
   etching the exposed part of the first protective layer underneath the seed layer to expose the seed layer;
   etching the exposed part of the seed layer to expose the nanoporous thin film having columnar grain structure; and
   etching the second protective layer to remove the second protective layer,
   wherein the size of the nanopores is adjusted by adjusting roughness of the surface deposited,
   wherein the first protective layer is formed of a material having etching selectivity with respect to the substrate and wherein the second protective layer is formed of a material having etching selectivity with respect to the substrate, the first protective layer and the nanoporous thin film.

4. The method of claim 3, wherein the size of the nanopores is adjusted due to the atomic shadowing effect according to an incident flux angle at which the deposition material is deposited.

5. A method for manufacturing a nanoporous membrane, the method comprising:
   forming a first protective layer on both surfaces of a substrate;
   forming a nanobead layer in the upper surface of the substrate;
   forming a nanoporous thin film having a columnar grain structure by depositing one of metallic materials, oxides, nitrides and fluorides on the nanobead layer formed in the upper surface of the substrate through a physical vapor deposition method or a chemical vapor deposition method;
   forming a second protective layer in the thin film;
   patterning the first protective layer formed in the lower surface of the substrate to expose a part of the lower surface of the substrate;
   etching the exposed part of the substrate until a part of the first protection layer underneath the nanobead layer is exposed;
   etching the exposed part of the first protective layer underneath the nanobead layer to expose the nanobead layer;
   etching the exposed part of the nanobead layer to expose the nanoporous thin film having the columnar grain structure; and
   etching the second protective layer to remove the second protective layer,
   wherein the size of the nanopores is adjusted by diameter of columnar grain depending on the size of the nanobead,
   wherein the first protective layer is formed of a material having etching selectivity with respect to the substrate and wherein the second protective layer is formed of a material having etching selectivity with respect to the substrate, the first protective layer and the nanoporous thin film.

6. The method of claim 5, wherein the size of the nanopores is adjusted due to the atomic shadowing effect according to an incident flux angle at which the deposition material is deposited.

* * * * *